(12) United States Patent
Yamashita et al.

(10) Patent No.: US 8,111,340 B2
(45) Date of Patent: Feb. 7, 2012

(54) DISPLAY APPARATUS

(75) Inventors: Kazuyoshi Yamashita, Kanagawa (JP); Yuichi Yamaguchi, Kanagawa (JP); Kazunori Hara, Kumamoto (JP)

(73) Assignee: Sony Corporation, Tokyo (JP)

( * ) Notice: Subject to any disclaimer, the term of this patent is extended or adjusted under 35 U.S.C. 154(b) by 537 days.

(21) Appl. No.: 11/849,590

(22) Filed: Sep. 4, 2007

(65) Prior Publication Data

US 2008/0067570 A1   Mar. 20, 2008

(30) Foreign Application Priority Data

Dec. 13, 2005   (JP) ................................ P2005-358402
Sep. 5, 2006   (JP) ................................ P2006-239730

(51) Int. Cl.
   *G02F 1/1336*   (2006.01)

(52) U.S. Cl. ................. 349/39; 349/38; 349/43

(58) Field of Classification Search ............. 349/38, 349/43; 257/306, E27.081
See application file for complete search history.

(56) References Cited

U.S. PATENT DOCUMENTS

| | | | |
|---|---|---|---|
| 5,922,515 A * | 7/1999 | Chiang et al. ................. | 430/312 |
| 5,943,105 A * | 8/1999 | Fujikawa et al. .............. | 349/39 |
| 6,387,790 B1 * | 5/2002 | Domenicucci et al. ....... | 438/592 |
| RE38,292 E * | 10/2003 | Satou ............................. | 438/158 |
| 7,508,462 B2 * | 3/2009 | Yamaguchi et al. ........... | 349/43 |
| 2001/0003678 A1 * | 6/2001 | Stinnett et al. ................ | 438/723 |
| 2002/0030219 A1 * | 3/2002 | Ando ............................. | 257/306 |
| 2005/0146649 A1 * | 7/2005 | Sato .............................. | 349/44 |
| 2005/0270445 A1 * | 12/2005 | Lee et al. ...................... | 349/108 |
| 2005/0285988 A1 * | 12/2005 | Nakagawa .................... | 349/44 |
| 2006/0049446 A1 * | 3/2006 | Kato ............................. | 257/306 |
| 2006/0146233 A1 * | 7/2006 | Park ............................. | 349/95 |
| 2006/0215070 A1 * | 9/2006 | Taniguchi et al. ............ | 349/43 |

FOREIGN PATENT DOCUMENTS

| | | |
|---|---|---|
| JP | 2004-342935 | 12/2004 |
| JP | 2005-222019 | 8/2005 |
| JP | 2005-250234 | 9/2005 |
| JP | 2005-277278 | 10/2005 |

OTHER PUBLICATIONS

Japanese Office Action issued on Oct. 13, 2011 in connection with Japanese Counterpart Application No. 2005-358402.

* cited by examiner

*Primary Examiner* — Thanh-Nhan Nguyen
(74) *Attorney, Agent, or Firm* — SNR Denton US LLP

(57) ABSTRACT

A display apparatus includes scanning lines; signal lines crossing the scanning lines; thin-film transistors connected to the scanning lines and the signal lines; capacitors connected to the thin-film transistors; interlayer insulating films disposed over the scanning lines with the signal lines, the thin-film transistors, and the capacitors disposed between or on the interlayer insulating films; upper interlayer insulating films disposed above the signal lines, the thin-film transistors, and the capacitors; common lines disposed between or on the upper interlayer insulating films; pixel electrodes disposed between or on the upper interlayer insulating films; and connection holes continuously penetrating the interlayer insulating films disposed between the common lines and the capacitors. The common lines and the capacitors are directly connected via the connection holes, and the connection holes have a ratio of depth to opening width of more than 1.

9 Claims, 8 Drawing Sheets

DISPLAY APPARATUS

CROSS REFERENCES TO RELATED APPLICATIONS

The present invention contains subject matter related to Japanese Patent Application JP 2006-239730 filed in the Japanese Patent Office on Sep. 5, 2006 and Japanese Patent Application JP 2005-358402 filed in the Japanese Patent Office on Dec. 13, 2005, the entire contents of which are incorporated herein by reference.

BACKGROUND OF THE INVENTION

1. Field of the Invention

The present invention relates to display apparatuses, and particularly to active-matrix display apparatuses having drive circuits for individual pixels.

2. Description of the Related Art

Flat-panel display apparatuses, typified by liquid crystal displays, can provide a display with high image quality at high response speed by employing an active-matrix structure where drive circuits including thin-film transistors (TFTs) are provided for individual pixels.

FIG. 9A is a partially cutaway schematic plan view of the main part of each pixel on the drive-panel side of a known active-matrix display apparatus, and FIG. 9B is a sectional view taken along line IXB-IXB of FIG. 9A, passing through connection holes. In FIGS. 9A and 9B, each pixel region includes a scanning line 4 extending in one direction, a first interlayer insulating film 11 covering the scanning line 4, and a capacitor Cs disposed on top of the first interlayer insulating film 11. The capacitor Cs includes a lower electrode 12c, a dielectric film 13c, and an upper electrode 14c which are sequentially stacked over the scanning line 4. The capacitor Cs is covered with a second interlayer insulating film 15 on which a signal line 5 is disposed so as to extend in a direction crossing the scanning line 4. Each pixel region corresponds to the intersection of the scanning line 4 and the signal line 5.

A relay electrode 200 connected to the upper electrode 14c of the capacitor Cs is disposed adjacent to the signal line 5 on the second interlayer insulating film 15 such that the relay electrode 200 overlaps the scanning line 4, and another relay line 5c is disposed adjacent to the relay electrode 200. The relay electrode 200 is connected to the upper electrode 14c via a connection hole 201 defined in the second interlayer insulating film 15. The relay electrode 200 is formed in an isolated island pattern so as to be insulated from the signal line 5 and the line 5c. The signal line 5, the relay electrode 200, and the line 5c are covered with a third interlayer insulating film 16 on which a common line 6 is disposed. The common line 6 is connected to the relay electrode 200 and thus the upper electrode 14c of the capacitor Cs via a connection hole 202 defined in the third interlayer insulating film 16. The common line 6 is connected to an electrode disposed on a counter panel in the periphery of the drive panel so that the potential of the upper electrode 14c of the capacitor Cs becomes the common potential. Thus, the common lines 6 are formed in a matrix pattern so as to cover the signal lines 5 and the scanning lines 4 or in a striped pattern so as to be divided between the signal lines 5. The common lines 6 also function as a light-shielding film for blocking light incident on transistors.

Another structure disclosed does not use the relay electrode 200 for connection between the upper electrode 14c of the capacitor Cs and the common line 6. In this structure, the upper electrode 14c of the capacitor Cs is directly connected to the common line 6 via a connection hole continuously penetrating the interlayer insulating films 15 and 16 shown in FIG. 9B. In this case, the aspect ratio of the connection hole, that is, the ratio of depth to width, is adjusted to 1 or less to prevent the inner line formed by sputtering from being discontinuous due to low coverage (see Japanese Unexamined Patent Application Publication No. 2005-222019).

SUMMARY OF THE INVENTION

Recently, flat-panel display apparatuses with higher aperture ratios per pixel and smaller pixel pitches have been demanded in view of providing higher display definition.

The structure illustrated in FIGS. 9A and 9B, however, requires a horizontal interline distance L1 between the relay electrode 200 and the line 5c and a horizontal interline distance L2 between the relay electrode 200 and the signal line 5 to completely insulate the relay electrode 200. To ensure high yield, the interline distances L1 and L2 should be at least 0.5 µm in terms of leaving margins for errors in dimension and alignment in a lithography step for forming the relay electrode 200.

Variations in dimension and alignment can also occur in lithography steps of a process for forming the connection holes 201 and 202 above and below the relay electrode 200. Hence, the width of the relay electrode 200 should be at least the sum of the opening diameters of the connection holes 201 and 202 plus margins L3 and L4 for the lithography steps of at least 0.1 µm.

The interline distances L1 and L2 and the margins L3 and L4 described above are factors contributing to the difficulty of reducing pixel pitch.

The structure including no relay electrode 200 as disclosed in the above publication eliminates the need to leave the margins L3 and L4 because the relay electrode 200 is omitted. However, the connection hole continuously penetrating the two interlayer insulating films 15 and 16 has a large opening width unless the thicknesses of the interlayer insulating films 15 and 16 are reduced, because the aspect ratio of the connection hole, that is, the ratio of depth to opening width, is 1 or less. This results in the difficulty of reducing pixel pitch.

Accordingly, it is desirable to provide an active-matrix display apparatus capable of achieving a reduced pixel pitch without decreasing aperture ratio, thus providing higher display definition.

A display apparatus according to an embodiment of the present invention includes scanning lines, a first interlayer insulating film covering the scanning lines, thin-film transistors and capacitors disposed on the first interlayer insulating film, a second interlayer insulating film covering the thin-film transistors and the capacitors, signal lines disposed on the second interlayer insulating film so as to cross the scanning lines, a third interlayer insulating film covering the signal lines, common lines disposed on the third interlayer insulating film and connected to the capacitors, a fourth interlayer insulating film covering the common lines, pixel electrodes disposed on the fourth interlayer insulating film, and connection holes continuously penetrating the second and third interlayer insulating films. In particular, the common lines and the capacitors are connected via the connection holes, and the connection holes have an aspect ratio, that is, a ratio of depth to opening width, of more than 1.

In this display apparatus, the capacitors are connected to the common lines via the connection holes continuously penetrating the two interlayer insulating films disposed between the common lines and the capacitors without providing a relay electrode between the two interlayer insulating films. In comparison with the case where a relay electrode is provided, the above structure eliminates the need to leave margins for alignment of connection holes used to connect the capacitors and the common lines to the relay electrode. In addition, the connection holes penetrating the two interlayer insulating films have an aspect ratio (ratio of depth to opening width) of more than 1 (i.e., deeper). Accordingly, the connection holes can have a small opening width irrespective of the thicknesses of the two interlayer insulating films penetrated by the connection holes. This allows for a reduction in the area used to connect the capacitors and the common lines.

As described above, therefore, the display apparatus according to the above embodiment of the present invention can reduce the area used to connect the capacitors and the common lines to achieve a reduced pixel pitch without decreasing aperture ratio, thus providing higher display definition.

DESCRIPTION OF THE PREFERRED EMBODIMENTS

Figure 9A:
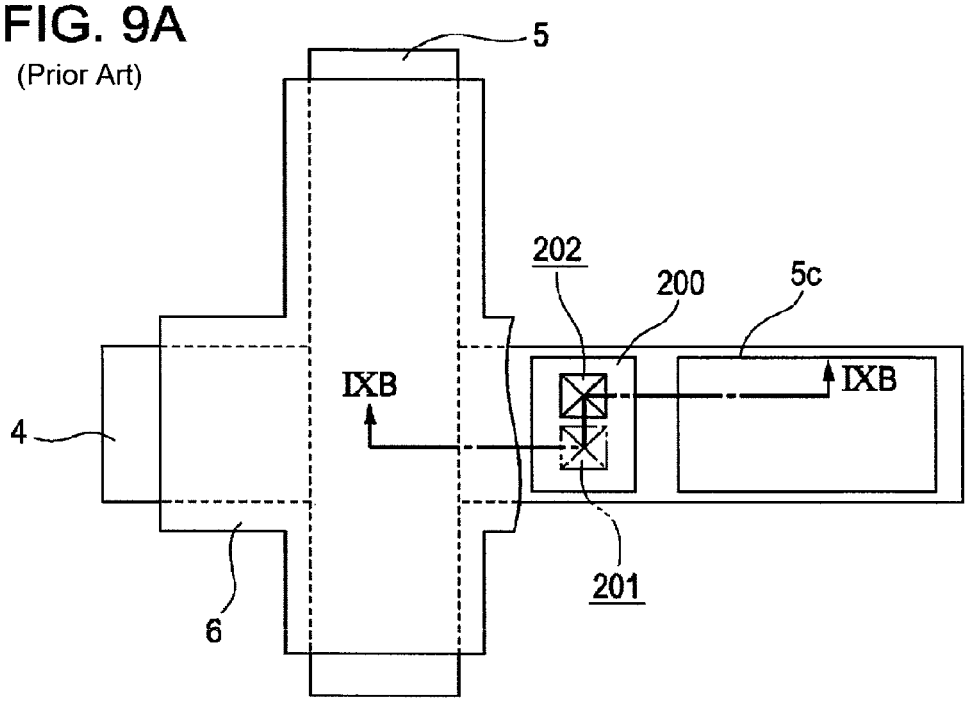
FIGS. 9A and 9B are diagrams illustrating the drive-panel side of a known active-matrix display apparatus.
Figure 9B:
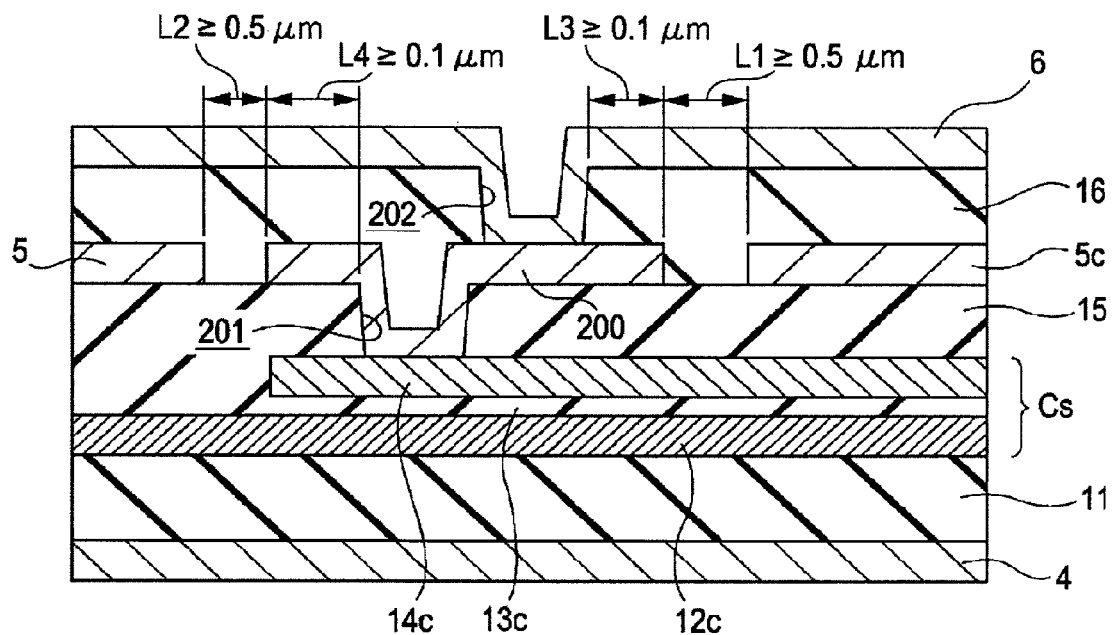

Active-matrix liquid crystal displays using liquid crystal materials as electrooptical materials will now be described in detail as examples of display apparatuses according to embodiments of the present invention with reference to the drawings. It should be noted that the embodiments of the present invention are not limited to liquid crystal displays and can be applied to a wide variety of display apparatuses using electrooptical materials, including organic electroluminescent (EL) displays using organic EL materials as electrooptical materials. The same parts as used in the known structure illustrated in FIGS. 9A and 9B are indicated by the same reference numerals in the following description.

First Embodiment

Figure 1:
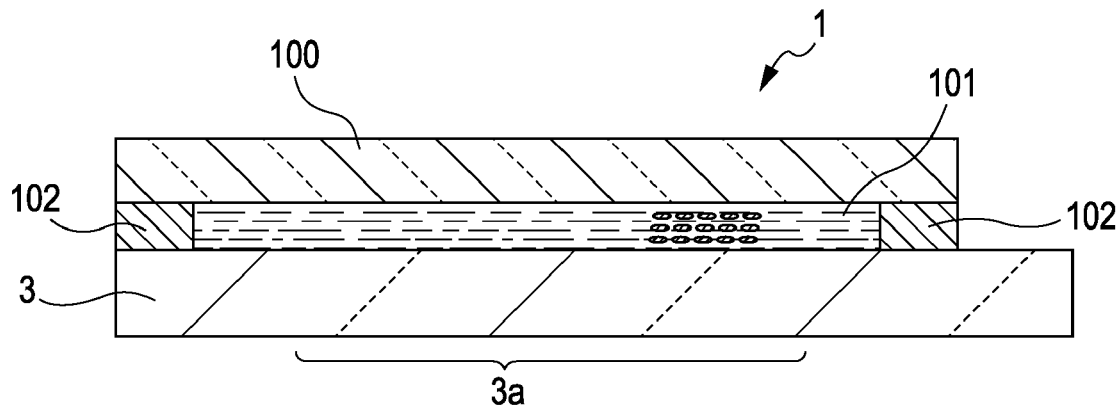
FIG. 1 is a sectional view of the overall structure of a display apparatus according to a first embodiment of the present invention.

FIG. 1 is a sectional view of the overall structure of a display apparatus according to a first embodiment of the present invention. A liquid crystal display 1 according to this embodiment includes a first substrate 3, a second substrate 100 disposed opposite the first substrate 3, and a liquid crystal layer 101 held therebetween.

The first substrate 3 is a transparent insulating substrate such as a glass substrate or a synthetic quartz substrate, a semiconductor substrate, or a silicon substrate and has a display region 3a defined in the center thereof. The first substrate 3 is used as a drive-panel substrate with pixel circuits arranged in a portion of the display region 3a opposite the liquid crystal layer 101. The second substrate 100, on the other hand, is a transparent insulating substrate such as a synthetic quartz substrate. The second substrate 100 is used as a counter substrate with a counter electrode disposed on a surface opposite the liquid crystal layer 101. The liquid crystal layer 101 is sealed between the first substrate 3 and the second substrate 100 with a sealant 102 disposed between the peripheries of the first substrate 3 and the second substrate 100.

Figure 2:
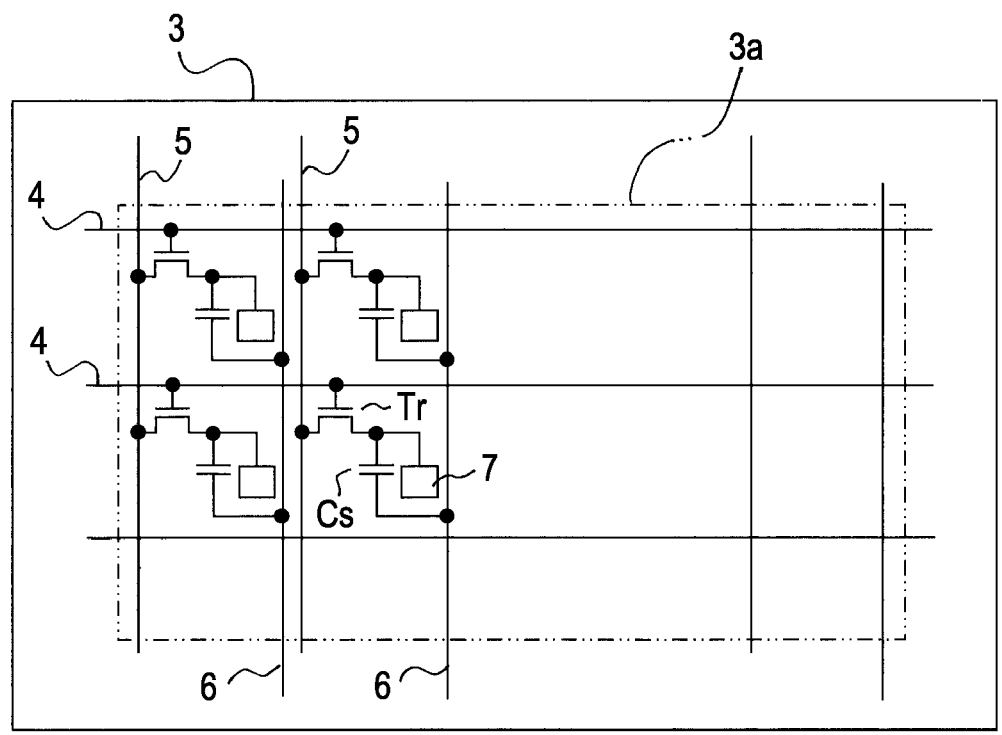
FIG. 2 is a circuit diagram of the display apparatus according to the first embodiment on the first-substrate side (on the drive-panel side)

FIG. 2 is a circuit diagram of the display apparatus 1 on the first-substrate 3 side (on the drive-panel side). In FIG. 2, scanning lines 4 and signal lines 5 are arranged in a matrix in the display region 3a defined in the center of the first substrate 3, with common lines 6 extending along the signal lines 5. TFTs Tr for pixel driving are arranged at the intersections of the scanning lines 4 and the signal lines 5 and are connected to capacitors Cs and pixel electrodes 7.

In addition, peripheral circuits such as a vertical transmission circuit connected to the scanning lines 4 and a horizontal transmission circuit connected to the signal lines 5 are disposed on the periphery of the display region 3a of the first substrate 3.

Figure 3:
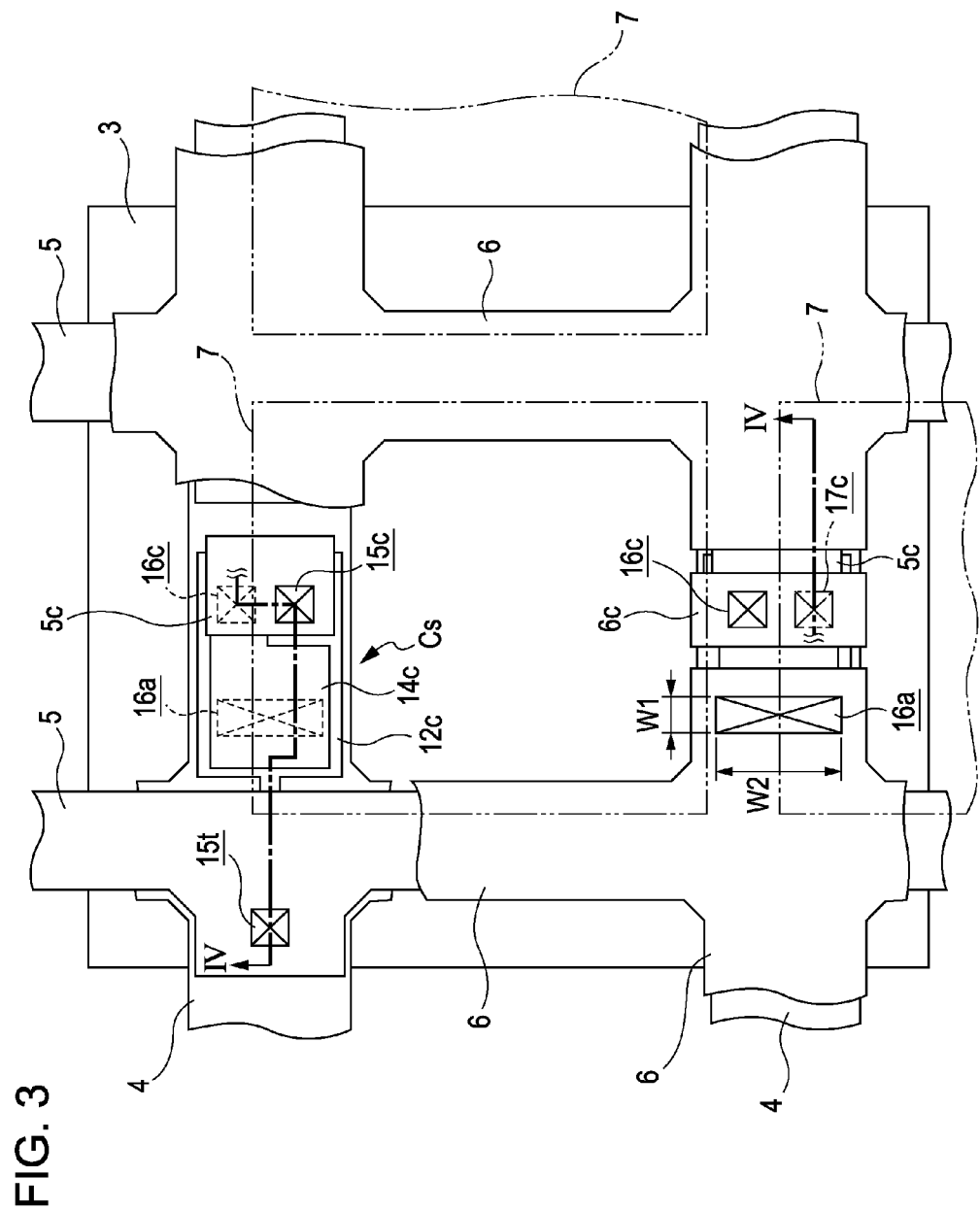
FIG. 3 is a schematic enlarged plan view of a pixel in a display region of the display apparatus according to the first embodiment.
Figure 4:
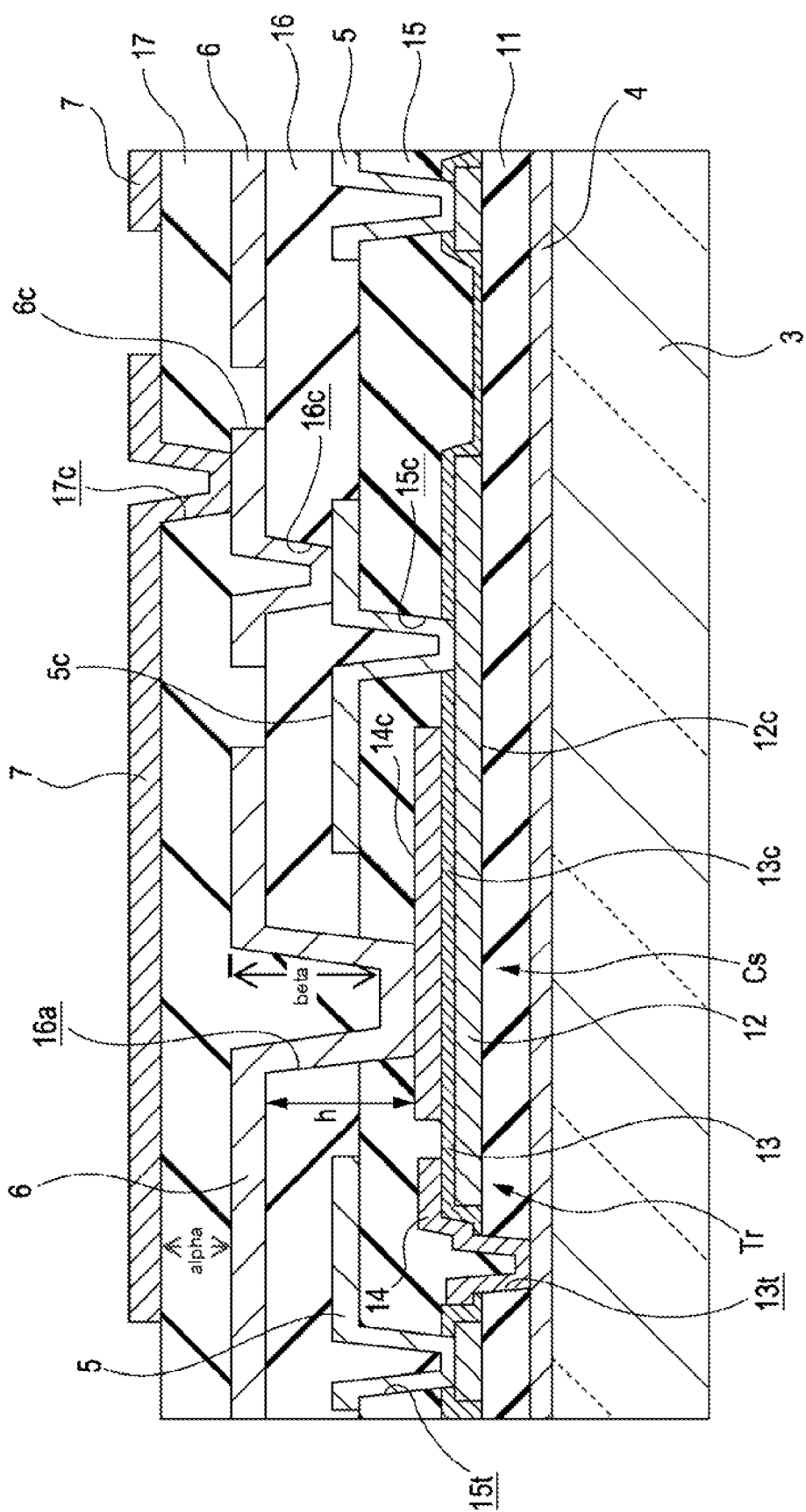
FIG. 4 is a sectional view taken along line IV-IV of FIG. 3, passing through lower connection holes.

Next, the detailed structure of the display region 3a of the first substrate 3 on the first-substrate 3 side will be described in order from the lower layers with reference to the plan view of FIG. 3 and the sectional view of FIG. 4. FIG. 3 is a partially cutaway schematic enlarged plan view of the main part of a pixel disposed at each of the intersections of the scanning lines 4 and the signal lines 5, where insulating films are omitted. FIG. 4 is a sectional view taken along line IV-IV of FIG. 3, passing through connection holes.

In FIGS. 3 and 4, the scanning lines 4 are arranged on the first substrate 3 in a first direction, and a first interlayer insulating film 11 is disposed over the scanning lines 4.

Each TFT Tr includes a semiconductor layer 12, a gate insulating film 13, and a gate electrode 14 (see the sectional view). The semiconductor layer 12 is formed on the first interlayer insulating film 11 in such a pattern as to overlap the scanning line 4. The gate insulating film 13 is disposed over the semiconductor layer 12 and is formed of silicon oxide. The gate electrode 14 is disposed on top of the gate insulating film 13. In plan view, the TFT Tr overlaps the scanning line 4. The gate electrode 14 is connected to the scanning line 4 via a connection hole 13t defined in the first interlayer insulating film 11 and the gate insulating film 13.

The capacitor Cs is disposed on the first interlayer insulating film 11 so as to overlap the scanning line 4. The capacitor Cs includes a lower electrode (pixel-potential electrode) 12c, an upper electrode (fixed-potential electrode) 14c, and a dielectric film 13c held therebetween. The lower electrode 12c is formed of an extended portion of the semiconductor layer 12 of the TFT Tr. The upper electrode 14c is formed of the same layer as the gate electrode 14. The dielectric film 13c is formed of an extended portion of the gate insulating film 13. The gate electrode 14 and the upper electrode 14c are formed of a conductive polycrystalline silicon film doped with an impurity such as phosphorus (P). The silicon film is formed to a thickness of about 200 nm by a known chemical vapor deposition (CVD) method.

A second interlayer insulating film 15 is disposed over the TFT Tr and the capacitor Cs on the first substrate 3. The second interlayer insulating film 15 is formed of, for example, silicon oxide. Connection holes 15t and 15c are defined in the second interlayer insulating film 15 and the underlying gate insulating film 13 (dielectric film 13c). The connection hole 15t leads to either a source or a drain of the semiconductor layer 12 of the TFT Tr. The connection hole 15c leads to the lower electrode 12c of the capacitor Cs on the side opposite the TFT Tr. If the second interlayer insulating film 15 is formed of silicon oxide, it should be formed to a thickness of at least 300 nm, preferably 500 to 800 nm, to suppress, for example, parasitic capacitance occurring between the overlying and underlying wiring lines. In this embodiment, for example, the second interlayer insulating film 15 has a thickness of about 500 nm.

The signal line 5 connected to the source or drain (semiconductor layer 12) of the TFT Tr via the connection hole 15t is disposed on the second interlayer insulating film 15. The signal line 5 extends perpendicularly to the scanning line 4 such that the TFT Tr is held therebetween.

A lower relay electrode 5c connected to the lower electrode 12c of the capacitor Cs via the other connection hole 15c is disposed between the adjacent signal lines 5 on the second interlayer insulating film 15 so as to overlap the scanning line 4. The lower relay electrode 5c is formed in an island pattern so as to be insulated from the signal lines 5.

The signal lines 5 and the lower relay electrode 5c are formed by patterning the same material layer. For example, the signal lines 5 and the lower relay electrode 5c are formed as a monolayer or multilayer structure using a metal such as aluminum (Al) or titanium (Ti), an alloy thereof, or a silicide such as tungsten silicide (WSi) or titanium silicide (TiSi). For example, the signal lines 5 and the lower relay electrode 5c can be formed as a multilayer structure such as WSi—Al, WSi—Al—WSi, Ti—Al, TiSi—Al, or TiSi—Al—WSi.

The signal lines 5 and the lower relay electrode 5c also function as a light-shielding film for the lower wiring lines and the TFT Tr. In particular, it is important that the lower relay electrode 5c have sufficient etching resistance when a connection hole is formed above the lower relay electrode 5c. Accordingly, the thickness of the material layer used to form the signal lines 5 and the lower relay electrode 5c should be at least equal to the thickness of the upper electrode 14c of the capacitor Cs, for example, about 500 nm, depending on the material of the material layer. The signal lines 5 and the lower relay electrode 5c are formed by patterning a material film deposited by, for example, sputtering or CVD. The signal lines 5 and the lower relay electrode 5c can also be connected to the lower layers through plugs formed by filling the connection holes 15t and 15c with a metal film.

A third interlayer insulating film 16 having a flat surface is disposed over the signal lines 5 and the lower relay electrode 5c. The third interlayer insulating film 16 is formed by depositing a silicon oxide film to a thickness of about 2 μm and planarizing the surface thereof through, for example, chemical mechanical polishing (CMP).

A connection hole 16c reaching the lower relay electrode 5c is defined in the third interlayer insulating film 16.

In addition, a connection hole 16a reaching the upper electrode 14c of the capacitor Cs is defined in the third interlayer insulating film 16 and the second interlayer insulating film 15. The connection hole 16a is formed in such a shape as to continuously penetrate the interlayer insulating films 15 and 16. In particular, the opening width W1 of the connection hole 16a in the direction in which the scanning lines 4 extend is smaller than the opening width W2 of the connection hole 16a in the direction in which the signal lines 5 extend. The opening width W1 is minimized to reduce the pixel pitch in the horizontal direction. In addition, the aspect ratio of the connection hole 16a, that is, the ratio of the depth h to the smaller opening width W1 (aspect ratio h/W1), is adjusted to more than 1. This structure can achieve excellent coverage over the bottom of the connection hole 16a in the subsequent step of depositing a metal film by sputtering to form the common lines 6. The connection hole 16a is preferably disposed as close to the TFT Tr as possible.

The connection hole 16a is formed as follows. First, a resist pattern having a connection-hole pattern is formed on the third interlayer insulating film 16 by a known lithography technique. Subsequently, the connection hole 16a is formed in the third interlayer insulating film 16 and the second interlayer insulating film 15 by etching, such as dry etching, using the resist pattern as a mask. In the dry etching, the flow rate of octafluorocyclobutane ($C_4F_8$) is decreased such that the flow rate ratio of $C_4F_8$ to oxygen ($O_2$) is gradually changed from about 10:1 to about 5:1. About ten seconds after the etching is started, the flow rate of $C_4F_8$ is decreased such that the flow rate ratio of $C_4F_8$ to $O_2$ is gradually changed from about 4:1 to about 2:1. The etching is carried out while controlling temperature. Thus, the connection hole 16a is formed in a uniform shape in the plane of the first substrate 3. The resist pattern is removed after the connection hole 16a is formed.

The connection hole 16c reaching the lower relay electrode 5c can be formed in the same step. In addition, if the peripheral drive circuits (not shown) are formed of the same layer as the signal lines 5 and connection holes reaching the layer are formed in the third interlayer insulating film 16, the connection holes can be formed in the same step as the connection holes 16a and 16c.

In this case, the connection holes for connection to the peripheral drive circuits can be formed to the same depth as or a shallower depth than the connection holes 16a and 16c. When the third interlayer insulating film 16, or the base, is planarized by CMP, the amount of polishing by CMP tends to be smaller in the peripheral drive-circuit region because of variations in the amount of polishing which depend on irregularities in the surface profile of the base. As a result, the third interlayer insulating film 16 tends to remain thick in the peripheral drive-circuit region. If the connection holes for connection to the peripheral drive circuits are formed to a shallower depth than the connection holes 16a and 16c in the same step, it is important to prevent the shallower connection holes from penetrating the conductive material layers to be exposed on the bottoms of the connection holes in the etching step for forming the connection holes by forming sufficiently thick conductive material layers.

The common line 6 connected to the upper electrode 14c of the capacitor Cs via the connection hole 16a and an upper relay electrode 6c connected to the lower relay electrode 5c via the connection hole 16c are disposed on the third interlayer insulating film 16.

The common lines 6 are formed in a matrix pattern so as to cover the signal lines 5 and the scanning lines 4. For example, the adjacent common lines 6 are at least partially divided between the signal lines 5 such that the common lines 6 extend parallel to the signal lines 5. The common lines 6 are connected to the electrode disposed on the counter panel in the periphery of the drive panel so that the potential of the upper electrodes 14c of the capacitors Cs becomes the common potential. The common lines 6 also function as a light-shielding film for blocking light incident on the TFTs Tr.

The upper relay electrode 6c is disposed between the common lines 6 so as to overlap the scanning line 4. The upper relay electrode 6c is formed in an island pattern so as to be electrically isolated from the common lines 6. Like the common lines 6, the upper relay electrode 6c also functions as a light-shielding film.

A portion not covered with the common lines 6 and the upper relay electrode 6c corresponds to the aperture of each pixel.

The common lines 6 and the upper relay electrode 6c are formed by patterning the same material layer. As in the case of the signal lines 5, for example, the common lines 6 and the upper relay electrode 6c are formed of a metal such as Al or Ti, an alloy thereof, a silicide such as WSi or TiSi, or a multilayer film thereof. The common lines 6 and the upper relay electrode 6c may be formed of the same material as or a different material from the signal lines 5 and the lower relay electrode 5c.

The material layer used to form the common lines 6 and the upper relay electrode 6c is deposited by sputtering, CVD, or other methods. However, sufficient coverage may be difficult to achieve over the bottom of the connection hole 16a penetrating the third interlayer insulating film 16 and the second interlayer insulating film 15 with a material layer deposited by a normal sputtering or CVD method because the depth h of the connection hole 16 is equal to the total thickness of the interlayer insulating films 15 and 16, namely, about 1,200 nm, and its aspect ratio h/W1 is high, namely, more than 1.

Accordingly, for example, a thicker material layer than normal is formed. If the material layer is an Al layer, for example, the material layer is formed to a thickness of 100 nm or more, preferably 200 to 600 nm. Alternatively, a plug can be formed in the connection hole 16a by completely filling it with the material layer. The material layer deposited in the connection hole 16a also has the effect of blocking light incident on the TFT Tr adjacent to the material layer. Similarly, the material layer deposited in the connection hole 16a also has the effect of blocking light incident on the lower wiring.

A fourth interlayer insulating film 17 is disposed over the common lines 6 and the upper relay electrode 6c. The fourth interlayer insulating film 17 is formed of, for example, silicon oxide. To prevent formation of voids in the connection hole 16a, which has a high aspect ratio, the fourth interlayer insulating film 17 is deposited with excellent coverage by CVD under conditions controlled so that the ratio of the thickness ($\beta$) of the fourth interlayer insulating film 17 on the bottom of the connection hole 16a to the thickness ($\alpha$) of the planar portion of the fourth interlayer insulating film 17, $\beta/\alpha$ is 0.7 or more.

The pixel electrode 7 is formed on the fourth interlayer insulating film 17 in such a pattern as to cover the aperture of the pixel. The pixel electrode 7 is formed of a transparent conductive material such as indium tin oxide (ITO). The pixel electrode 7 is connected to the upper relay electrode 6c via a connection hole 17c defined in the fourth interlayer insulating film 17 and accordingly is connected to the upper electrode 14c of the capacitor Cs through the upper relay electrode 6c. Although not shown herein, an alignment film is disposed over the pixel electrode 7.

On the other hand, the counter electrode connected to the common potential is disposed on the surface of the second substrate 100 shown in FIG. 1 facing the liquid crystal layer 101, and an alignment film is disposed over the counter electrode.

In the display apparatus 1, as described with reference to FIGS. 3 and 4, the capacitor Cs is connected to the common line 6 via the connection hole 16a continuously penetrating the two interlayer insulating films 15 and 16, that is, without providing a relay electrode between the two interlayer insulating films 15 and 16. In comparison with the known structure illustrated in FIG. 9, where the relay electrode 200 is provided in the same layer as the signal lines 5 between the two interlayer insulating films 15 and 16 to connect the capacitor Cs to the common line 6, the structure according to this embodiment eliminates the need to leave the margins (L3+L4) for alignment of the connection holes used to connect the capacitor Cs and the common line 6 to the relay electrode 200.

In the structure of the display apparatus 1, additionally, the connection hole 16a penetrating the two interlayer insulating films 15 and 16 has an aspect ratio (ratio of depth h to opening width W1) of more than 1. Accordingly, the connection hole 16a can have a small opening width W1 irrespective of the thicknesses of the two interlayer insulating films 15 and 16.

The display apparatus 1 according to the embodiment described above can reduce the area used to connect the capacitor Cs and the common line 6. The display apparatus 1 can therefore reduce the distance between the signal lines 5 and the lower relay electrode 5c to achieve a reduced pixel pitch without decreasing the aperture ratio of the pixels. In particular, the connection hole 16a is formed in such an opening shape that the opening width W1 in the direction in which the scanning lines 4 extend is smaller than the opening width W2 in the direction in which the signal lines 5 extend and that the opening width W1 is minimized. This allows for a further reduction in pixel pitch. As described above, the display apparatus 1 can achieve a reduced pixel pitch without decreasing the aperture ratio of the pixels, thus providing higher display definition.

In the display apparatus 1 according to this embodiment, additionally, the connection hole 16a is disposed adjacent to the TFT Tr so that the material layer formed in the connection hole 16a provides the effect of blocking light incident on the TFT Tr. In this structure, the connection hole 16a is formed in such an opening shape that the opening width W1 in the direction in which the scanning lines 4 extend is smaller than the opening width W2 in the direction in which the signal lines 5 extend; that is, the connection hole 16a is formed in a rectangular shape elongated in the direction in which the signal lines 5 extend. This increases the area where the light incident on the TFT Tr is blocked. The light-shielding effect can be further enhanced by adjusting the aspect ratio of the connection hole 16a to more than 1 and forming a thicker material layer than normal in the connection hole 16a.

Figure 5:
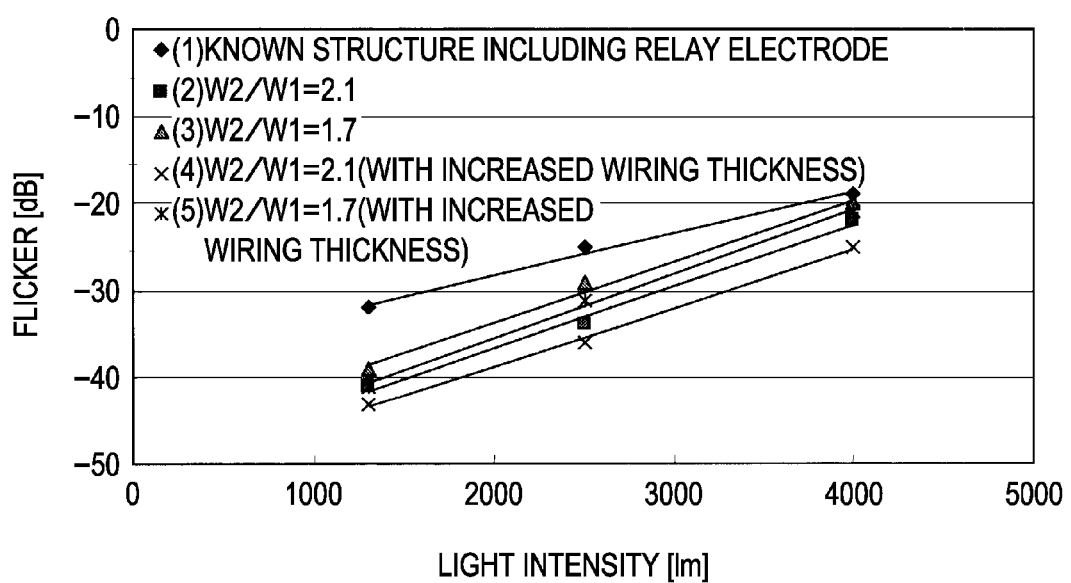
FIG. 5 is a graph showing measurements on sample substrates for the relationship between irradiation light intensity (lm) and TFT flicker level (dB)

FIG. 5 shows measurements on sample substrates (1) to (5) for the relationship between the intensity (lm) of irradiation light and the flicker level (dB) of the TFT Tr. The sample substrate (1) has the same structure as the known structure shown in FIG. 9, which includes the relay electrode 200. The sample substrates (2) to (5) has the same structure as that according to this embodiment but vary in the opening shape (W2/W1) of the connection hole 16a and the thickness of the material layer in the connection hole 16a.

FIG. 5 shows that the sample substrates (2) to (5) according to this embodiment, in which the material layer was disposed in the connection hole 16a penetrating the two interlayer insulating films 15 and 16, provided higher display quality than the sample substrate (1) having the known structure, particularly, a higher flicker-suppressing effect. These results demonstrate that the structure according to this embodiment has a higher light-shielding effect on the TFT Tr. In addition, the sample substrates (2) and (4), in which the opening shape (W2/W1) of the connection hole 16a was more elongated in the direction in which the signal lines 5 extended than in the sample substrates (3) and (5), provided a higher flicker-suppressing effect than the sample substrates (3) and (5). These results demonstrate that the light-shielding effect can be enhanced by forming the connection hole 16a in an opening shape (W2/W1) elongated along the signal lines 5. Furthermore, the sample substrates (4) and (5), in which a thicker material layer was formed in the connection hole 16a, provided a higher flicker-suppressing effect than the sample substrates (2) and (3) having the same opening shapes (W2/W1), respectively. These results demonstrate that the light-shielding effect can be enhanced by forming a thicker material layer in the connection hole 16a.

In this embodiment, as shown in FIG. 4, the material layer used to form the signal lines 5 and the lower relay electrode 5c on the second interlayer insulating film 15 is formed to a sufficient thickness. Hence, if the connection holes 16a and 16c are formed in the same step, the deeper connection hole 16a can be formed to a sufficient depth by etching while the shallower connection hole 16c does not penetrate the lower relay electrode 5c during the etching even after reaching the lower relay electrode 5c.

Specifically, if the interlayer insulating films 15 and 16 are formed of silicon oxide and the lower relay electrode 5c is formed of a metal material, the etching ratio of the silicon oxide to the metal material is about 15:1 to 20:1. Accordingly, the material layer should be formed to such a thickness that the connection hole 16c, which is completed before the completion of the connection hole 16a, does not penetrate the lower relay electrode 5c before the completion of the connection hole 16a. If, for example, the connection hole 16a is formed to a depth of 1,500 nm and the connection hole 16c is formed to a depth of 500 nm, the lower relay electrode 5c under the connection hole 16c is generally etched to a depth of about 70 to 100 nm before the completion of the connection hole 16a. In addition, the upper electrode 14c is overetched to about several tens of percent in the connection hole 16a to avoid variations in in-plane resistance and contact failure. Because the upper electrode 14c and the lower relay electrode 5c are etched at similar rates, the lower relay electrode 5c is further etched by a depth similar to the depth to which the upper electrode 14c is overetched. In the above method, therefore, the lower relay electrode 5c is etched to a total depth of about 100 to 200 nm before the completion of the connection hole 16a.

Accordingly, if the connection holes 16a and 16c are to be formed in the same etching step by the method described above, the lower relay electrode 5c should be formed to a thickness that is at least equal to, or higher than, the thickness of the upper electrode 14c in view of lot-to-lot variations and in-plane variations.

The simultaneous formation of the two different connection holes 16a and 16c in the same step reduces the number of production steps and the number of expensive reticles used, thus contributing to reduced manufacturing costs.

Second Embodiment

Figure 6:
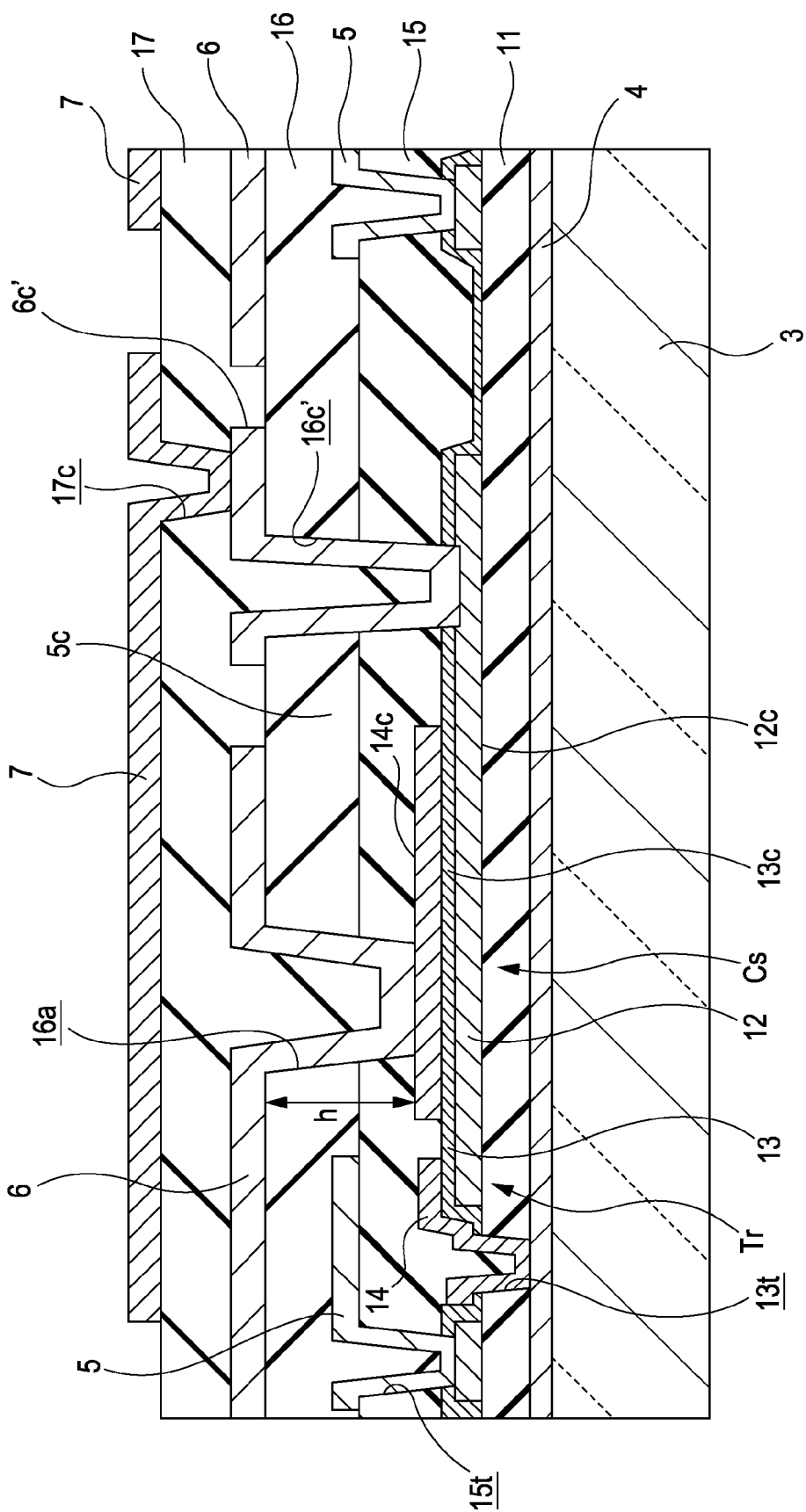
FIG. 6 is a sectional view illustrating a second embodiment of the present invention.

FIG. 6 is a sectional view illustrating a second embodiment of the present invention. The same components as used in FIG. 4 in the first embodiment are indicated by the same reference numerals, and the description thereof will not be repeated.

A display apparatus shown in FIG. 6 according to the second embodiment of the present invention differs from that according to the first embodiment in that the pixel electrode 7 is connected to the lower electrode 12c of the capacitor Cs only through a relay electrode 6c' formed of the same layer as the common lines 6. The relay electrode 6c' is disposed on the flat surface of the third interlayer insulating film 16 and is connected to the lower electrode 12c of the capacitor Cs via a connection hole 16c' formed in the third interlayer insulating film 16, the second interlayer insulating film 15, and the gate insulating film 13.

In this display apparatus, the connection hole 16c' for connection between the relay electrode 6c' and the capacitor Cs is deeper than the connection hole 16a for connection between the common line 6 and the capacitor Cs. The connection hole 16c' is preferably formed in the same single step as the connection hole 16a, although two or more steps can also be carried out to form the connection hole 16c' because it has a high aspect ratio. Alternatively, a plug can be formed in the deep connection hole 16c' to connect the relay electrode 6c' to the capacitor Cs so that no break occurs between the relay electrode 6c' and the capacitor Cs.

The present invention can also be applied to the display apparatus having the above structure. This embodiment can provide the same advantages as the first embodiment because the common line 6 and the capacitor Cs are directly connected via the connection hole 16a continuously penetrating the interlayer insulating films 15 and 16 disposed between the common line 6 and the capacitor Cs and the connection hole 16a has a ratio of depth to opening width of more than 1.

In the second embodiment, particularly, the pixel electrode 7 is connected to the lower electrode 12c of the capacitor Cs only through the relay electrode 6c' formed of the same layer as the common lines 6. This eliminates the need to form a relay electrode in the same layer as the signal lines 5 and therefore increases wiring flexibility in that layer, thus providing a reduced pixel pitch and a higher aperture ratio.

Third Embodiment

Figure 7:
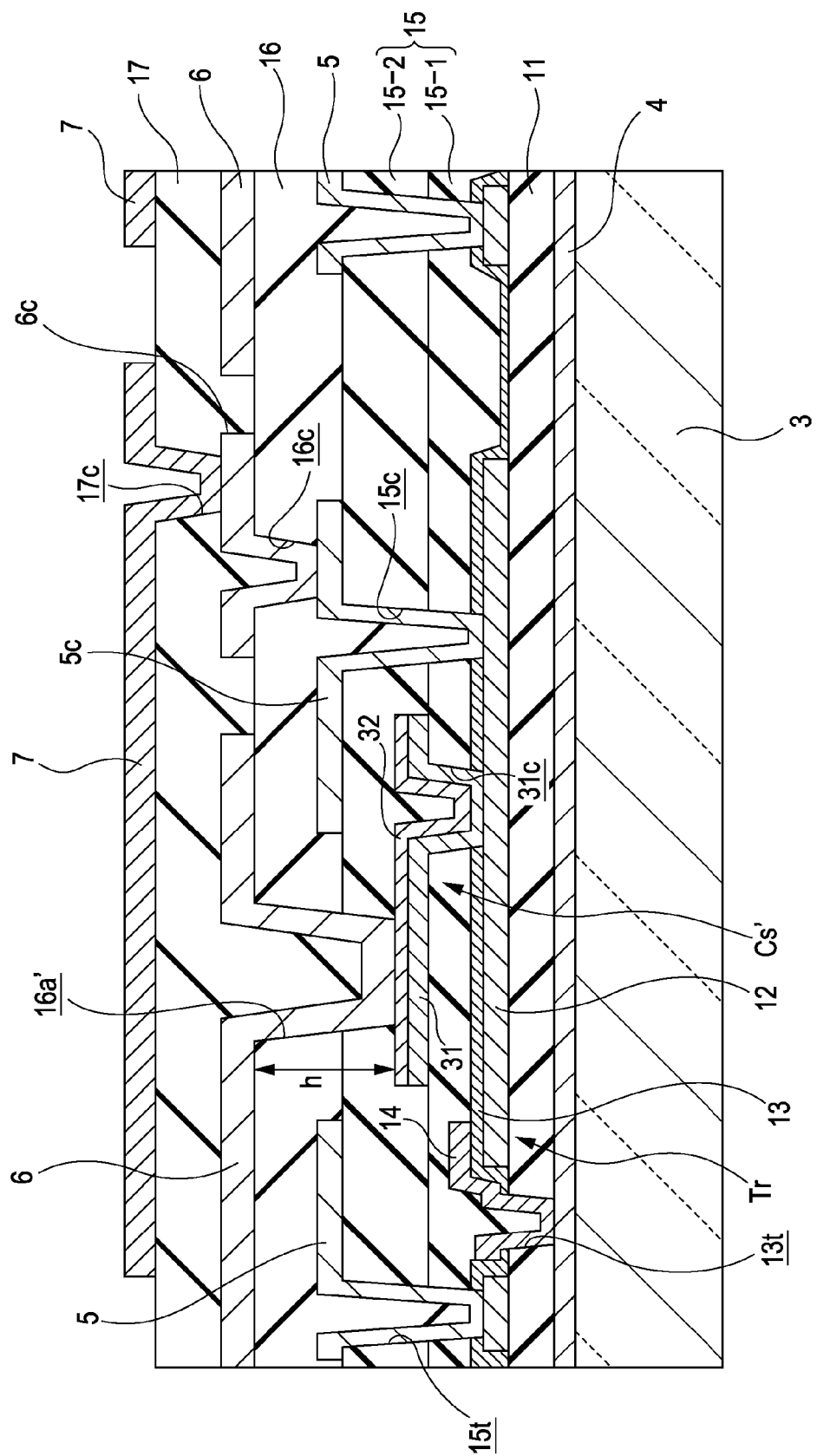
FIG. 7 is a sectional view illustrating a third embodiment of the present invention.

FIG. 7 is a sectional view illustrating a third embodiment of the present invention. The same components as used in FIG. 4 in the first embodiment are indicated by the same reference numerals, and the description thereof will not be repeated.

A display apparatus shown in FIG. 7 according to the third embodiment of the present invention differs from that according to the first embodiment in the layer where a capacitor Cs' is disposed. Specifically, the capacitor Cs' is disposed inside the second interlayer insulating film 15 covering the TFT Tr as a different layer from the layer including the TFT Tr.

For example, the second interlayer insulating film 15 has a double-layer structure including a lower insulating film 15-1 and an upper insulating film 15-2 with the capacitor Cs' disposed therebetween. The capacitor Cs' includes a lower electrode (pixel-potential electrode) 31, an upper electrode (fixed-potential electrode) 32, and a dielectric film (not shown) held therebetween. The lower electrode 31 is connected to the semiconductor layer 12 constituting the TFT Tr via a connection hole 31c defined in the lower insulating film 15-1 of the second interlayer insulating film 15 and the gate insulating film 13. The dielectric film is a silicon oxide film or a silicon nitride film.

As in the first embodiment, the signal lines 5 and the lower relay electrode 5c are disposed on the second interlayer insulating film 15 having the multilayer structure, and the structure upper than these is similar to that of the first embodiment. The common line 6 is connected to the upper electrode 32 of the capacitor Cs' via a connection hole 16a' defined in the third interlayer insulating film 16 and the upper insulating film 15-2 of the second interlayer insulating film 15. The connection hole 16a' is similar to the connection hole 16a of the first embodiment and can be formed in the same step as the connection hole 16c for connection between the upper relay electrode 6c and the lower relay electrode 5c.

The present invention can also be applied to the display apparatus having the above structure. This embodiment can provide the same advantages as the first embodiment because the common line 6 and the capacitor Cs'are directly connected via the connection hole 16a' continuously penetrating the interlayer insulating films 15-2 and 16 disposed between the common line 6 and the capacitor Cs' and the connection hole 16a' has a ratio of depth to opening width of more than 1.

Fourth Embodiment

Figure 8:
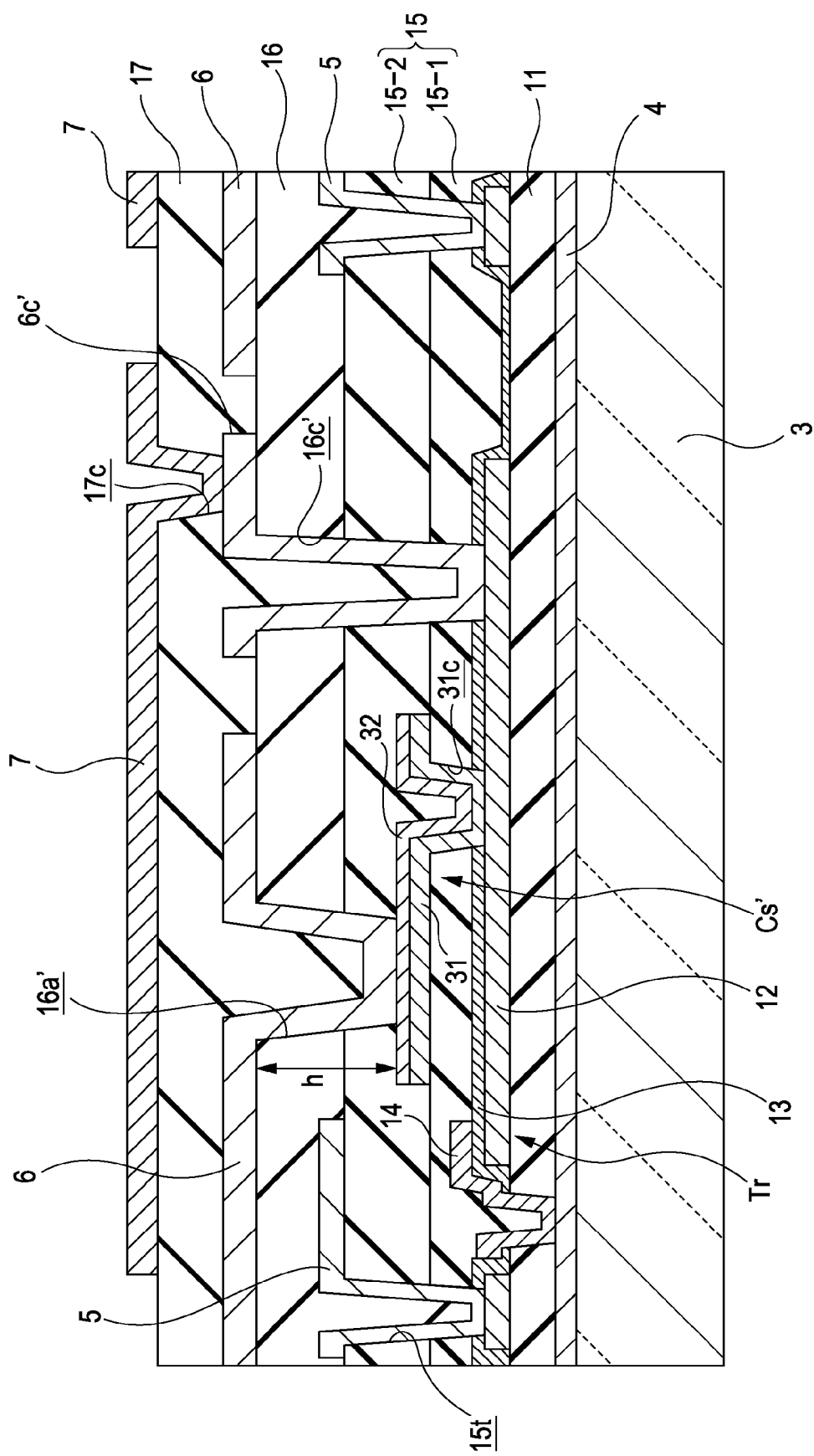
FIG. 8 is a sectional view illustrating a fourth embodiment of the present invention.

FIG. 8 is a sectional view illustrating a fourth embodiment of the present invention. The same components as used in FIG. 7 in the third embodiment are indicated by the same reference numerals, and the description thereof will not be repeated.

A display apparatus shown in FIG. 8 according to the fourth embodiment of the present invention differs from that according to the third embodiment in that the pixel electrode 7 is connected to the semiconductor layer 12 connected to the lower electrode 31 of the capacitor Cs' only through the relay electrode 6c' formed of the same layer as the common lines 6. The relay electrode 6c' is disposed on the flat surface of the third interlayer insulating film 16 and is connected to the semiconductor layer 12 connected to the lower electrode 31 of the capacitor Cs' via the connection hole 16c' formed in the third interlayer insulating film 16, the second interlayer insulating film 15, and the gate insulating film 13.

In this display apparatus, the connection hole 16c' for connection between the relay electrode 6c' and the semiconductor layer 12 is deeper than the connection hole 16a' for connection between the common line 6 and the capacitor Cs'. The connection hole 16c' is preferably formed in the same single step as the connection hole 16a', although two or more steps can also be carried out to form the connection hole 16c' because it has a high aspect ratio. Alternatively, a plug can be formed in the deep connection hole 16c' to connect the relay electrode 6c' to the semiconductor layer 12 so that no break occurs between the relay electrode 6c' and the semiconductor layer 12.

The present invention can also be applied to the display apparatus having the above structure. This embodiment can provide the same advantages as the first embodiment because the common line 6 and the capacitor Cs' are directly connected via the connection hole 16a' continuously penetrating the interlayer insulating films 15-2 and 16 disposed between the common line 6 and the capacitor Cs' and the connection hole 16a' has a ratio of depth to opening width of more than 1.

In the fourth embodiment, particularly, the pixel electrode 7 is connected to the semiconductor layer 12 connected to the capacitor Cs' only through the relay electrode 6c' formed of the same layer as the common lines 6. This eliminates the need to form a relay electrode in the same layer as the signal lines 5 and therefore increases wiring flexibility in that layer, thus providing a reduced pixel pitch and a higher aperture ratio.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising:
    scanning lines;
    signal lines crossing the scanning lines;
    thin-film transistors connected to the scanning lines and the signal lines;
    capacitors including a lower electrode, a dielectric film, and an upper electrode sequentially stacked over the scanning lines, the capacitors being connected to the thin-film transistors;
    a plurality of interlayer insulating films disposed over the scanning lines such that the signal lines, the thin-film transistors, and the capacitors are disposed between or on the plurality of interlayer insulating films;
    a plurality of upper interlayer insulating films included in the plurality of interlayer insulating films and disposed above the signal lines, the thin-film transistors, and the capacitors;
    common lines disposed between or on the plurality of upper interlayer insulating films;
    pixel electrodes disposed between or on the plurality of upper interlayer insulating films; and
    connection holes continuously penetrating the plurality of interlayer insulating films disposed between the common lines and the capacitors, the common lines and the capacitors being directly interconnected via the connection holes, and the connection holes having a ratio of depth to opening width of more than 1,
    wherein,
    one of the common lines is disposed on one of the plurality of upper interlayer insulation films and in one of the connection holes to directly connect the one common line to one of the capacitors, and
    the one of the plurality of upper interlayer insulating films is formed so that a ratio ($\beta/\alpha$) of a first thickness ($\beta$) of the one of the plurality of upper interlayer insulation films from a bottom of the one connection hole to a height of the commons lines next to the connection hole to a thickness ($\alpha$) of a portion of the one of the plurality of upper interlayer insulation films disposed on the one common line next to the one connection hole is 0.7 or more.

2. The display apparatus according to claim 1, wherein the connection holes are positioned so as to overlap the scanning lines; and the opening width of the connection holes along the signal lines is larger than that of the connection holes along the scanning lines.

3. The display apparatus according to claim 2, wherein the ratio of the depth to the opening width of the connection holes along the scanning lines is more than 1.

4. The display apparatus according to claim 2, wherein the thin-film transistors are positioned so as to overlap intersections of the scanning lines and the signal lines; and the connection holes are adjacent to the thin-film transistors.

5. The display apparatus according to claim 1, further comprising relay electrodes disposed in the same layer as the signal lines to connect the capacitors and the pixel electrodes such that the connection holes are positioned between the signal lines and the relay electrodes.

6. The display apparatus according to claim 5, further comprising:
    second relay electrodes disposed in the same layer as the common lines to connect the capacitors and the pixel electrodes; and
    connection holes, for providing connection between the second relay electrodes and the lower relay electrodes, formed in the same step as the connection holes for connection between the common lines and the capacitors.

7. The display apparatus according to claim 1, further comprising:
   relay electrodes disposed in the same layer as the common lines to connect the capacitors and the pixel electrodes; and
   connection holes, for providing connection between the relay electrodes and the capacitors, formed in the same step as the connection holes for connection between the common lines and the capacitors.

8. The display apparatus according to claim 1, wherein the connection holes for connection between the common lines and the capacitors and the other connection holes are formed in the same step.

9. The display apparatus according to claim 1, wherein the plurality of interlayer insulating films include a first, second, third, and fourth interlayer insulating film, wherein the third and fourth interlayer insulating film comprise the plurality of upper interlayer insulating films.

* * * * *